US008032855B1

(12) United States Patent
Ling et al.

(10) Patent No.: US 8,032,855 B1
(45) Date of Patent: Oct. 4, 2011

(54) METHOD AND APPARATUS FOR PERFORMING INCREMENTAL PLACEMENT ON A STRUCTURED APPLICATION SPECIFIC INTEGRATED CIRCUIT

(75) Inventors: Andrew C. Ling, Toronto (CA); Deshanand Singh, Mississauga (CA)

(73) Assignee: Altera Corporation, San Jose, CA (US)

(*) Notice: Subject to any disclaimer, the term of this patent is extended or adjusted under 35 U.S.C. 154(b) by 851 days.

(21) Appl. No.: 11/295,354

(22) Filed: Dec. 6, 2005

(51) Int. Cl.
*G06F 17/50* (2006.01)

(52) U.S. Cl. ......... 716/122; 716/119; 716/132; 716/134

(58) Field of Classification Search ............... 716/9, 10, 716/13, 2, 8, 119, 122, 132, 134
See application file for complete search history.

(56) References Cited

U.S. PATENT DOCUMENTS

| | | | | |
|---|---|---|---|---|
| 5,267,176 A * | 11/1993 | Antreich et al. | ............... | 716/10 |
| 5,619,419 A * | 4/1997 | D'Haeseleer et al. | ............ | 716/8 |
| 5,808,899 A * | 9/1998 | Scepanovic et al. | .............. | 716/2 |
| 5,844,811 A * | 12/1998 | Scepanovic et al. | ............ | 716/10 |
| 6,085,032 A * | 7/2000 | Scepanovic et al. | ............ | 716/10 |
| 6,155,725 A * | 12/2000 | Scepanovic et al. | .............. | 716/9 |
| 6,192,508 B1 * | 2/2001 | Malik et al. | ........................ | 716/9 |
| 6,301,693 B1 * | 10/2001 | Naylor et al. | .................... | 716/10 |
| 6,370,673 B1 * | 4/2002 | Hill | .................................. | 716/2 |
| 6,415,425 B1 * | 7/2002 | Chaudhary et al. | ............... | 716/9 |
| 6,415,426 B1 * | 7/2002 | Chang et al. | ...................... | 716/9 |
| 6,480,991 B1 * | 11/2002 | Cho et al. | .......................... | 716/8 |
| 6,493,658 B1 * | 12/2002 | Koford et al. | ...................... | 703/1 |
| 6,789,244 B1 * | 9/2004 | Dasasathyan et al. | .......... | 716/10 |
| 6,948,143 B2 * | 9/2005 | Donelly et al. | .................... | 716/9 |
| 7,065,730 B2 * | 6/2006 | Alpert et al. | .................... | 716/13 |
| 7,076,755 B2 * | 7/2006 | Ren et al. | ........................... | 716/9 |
| 7,089,521 B2 * | 8/2006 | Kurzum et al. | .................. | 716/10 |
| 7,143,380 B1 * | 11/2006 | Anderson et al. | ............... | 716/10 |
| 7,200,827 B1 * | 4/2007 | Ku et al. | ............................ | 716/9 |
| 7,210,113 B2 * | 4/2007 | Andreev et al. | ................. | 716/10 |
| 7,225,116 B2 * | 5/2007 | Harn | ................................ | 703/14 |
| 2003/0182649 A1 * | 9/2003 | Harn | ................................ | 716/11 |
| 2003/0217338 A1 * | 11/2003 | Holmes et al. | ..................... | 716/2 |
| 2004/0040007 A1 * | 2/2004 | Harn | ................................ | 716/11 |
| 2004/0078770 A1 * | 4/2004 | Miller et al. | ...................... | 716/10 |
| 2005/0155007 A1 * | 7/2005 | Kurokawa et al. | .............. | 716/10 |
| 2005/0166169 A1 * | 7/2005 | Kurzum et al. | .................. | 716/10 |
| 2005/0172252 A1 * | 8/2005 | Cheng et al. | ..................... | 716/10 |
| 2006/0090151 A1 * | 4/2006 | Miller et al. | ....................... | 716/8 |
| 2006/0190899 A1 * | 8/2006 | Migatz et al. | .................... | 716/13 |
| 2007/0143724 A1 * | 6/2007 | Alpert et al. | ..................... | 716/10 |

* cited by examiner

*Primary Examiner* — Jack Chiang
*Assistant Examiner* — Patrick Sandoval
(74) *Attorney, Agent, or Firm* — L. Cho

(57) ABSTRACT

A method for placing a system on a structured application specific integrated circuit (ASIC) using an electronic design automation tool is disclosed. A subregion that includes an illegal position in a placement solution is identified. All structured ASIC cells in the subregion are removed. Positions for all the structured ASIC cells that are legal are determined.

28 Claims, 9 Drawing Sheets

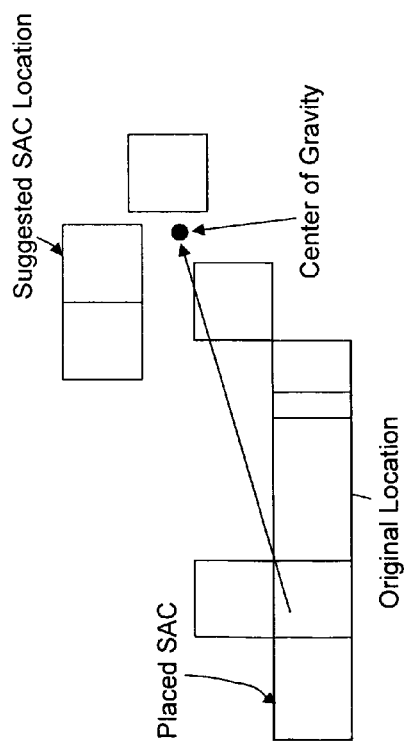
FIG. 7a
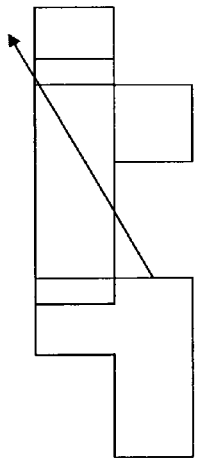
FIG. 7b
FIG. 7c

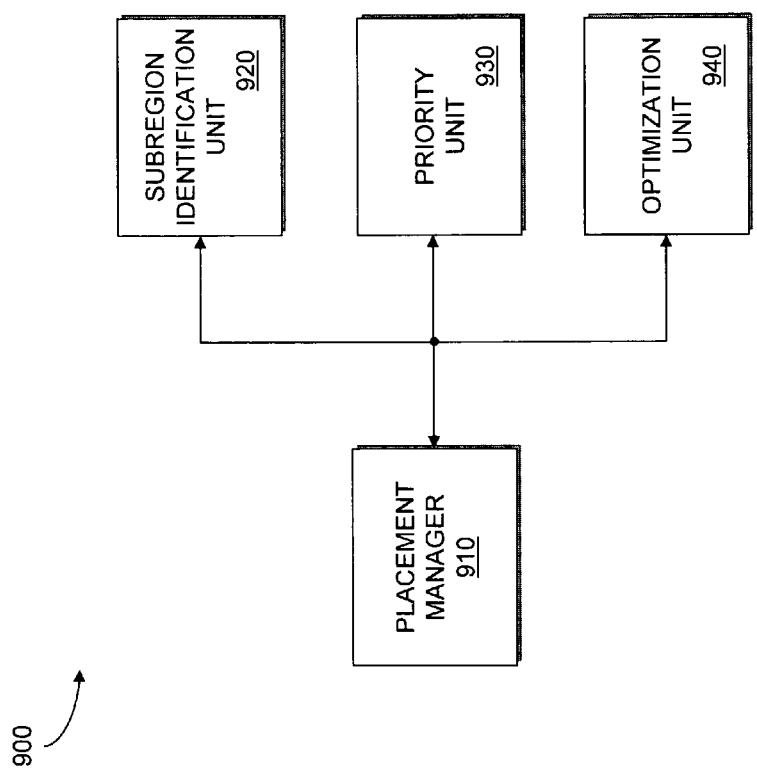

METHOD AND APPARATUS FOR PERFORMING INCREMENTAL PLACEMENT ON A STRUCTURED APPLICATION SPECIFIC INTEGRATED CIRCUIT

TECHNICAL FIELD

The present invention relates to electronic design automation (EDA) tools. More specifically, the present invention relates to a method and apparatus for performing incremental placement on a structured application specific integrated circuit (ASIC) when modifications are made after initial placement.

BACKGROUND

Structured ASICs may be used to implement large systems that include millions of gates and megabits of embedded memory. Of the tasks required in managing and optimizing a design, designing components and placement of the components on the structured ASICs utilizing available resources can be the most challenging and time consuming. In order to satisfy placement and timing specifications, EDA tools are used to manage and optimize their design onto physical target devices. Automated synthesis and placement algorithms in EDA tools perform the time consuming task of designing and placement of components onto physical devices.

As the complexity of circuits increase, traditional synthesis methods often are unable to produce a timing optimal solution. Delays associated with unplaced circuits are difficult to estimate which make optimization for timing challenging for the traditional synthesis methods. One approach taken by circuit designers to improve timing is to perform physical synthesis which involves re-synthesizing the circuit incrementally after placement. Physical synthesis allows delays to be modeled more accurately after placement when cell positions have been determined.

The optimizations that are performed during physical synthesis will usually lead to a placement that is illegal. For example, one optimization technique that is commonly used is component duplication where nodes feeding a critical connection are duplicated and the duplicated node is moved to its critical fanout connection. A problem with this optimization technique is that congestion often occurs after duplication. When modifications made to a system produce a placement that is illegal, current EDA tools require a re-work of the entire placement procedure. This may require a significant amount of time which is inefficient and undesirable.

Thus, what is needed is an efficient method and apparatus for performing incremental placement on a structured ASIC.

SUMMARY

According to an embodiment of the present invention, a method for placing a system on a structured ASIC using an electronic design automation tool is described that provides guided movement of structured ASIC cells to remove illegalities in placement. Techniques for solving the transportation problem are used to determine positions for structured ASIC cells that are legal. According to one embodiment, a subregion is identified that includes an illegal position in a placement solution. All structured ASIC cells in the subregion are removed. Positions are determined for all the structured ASIC cells that are legal.

BRIEF DESCRIPTION OF THE DRAWINGS

The features and advantages of the present invention are illustrated by way of example and are by no means intended to limit the scope of the present invention to the particular embodiments shown.

FIG. 7a-c illustrate an example of replacement using a suggested location from a solution to the transportation problem.

FIG. 9 illustrates an incremental placement unit according to an embodiment of the present invention.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
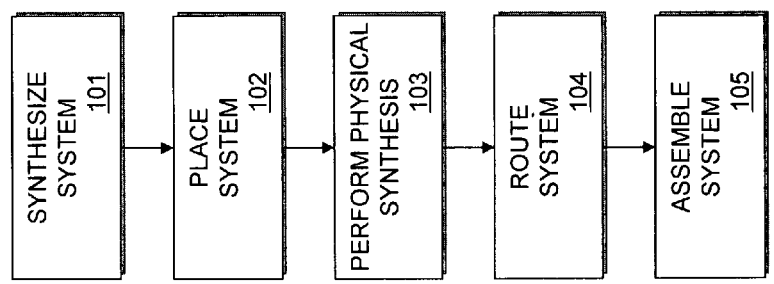
FIG. 1 is a flow chart that illustrates a method for designing a system on a target device according to an embodiment of the present invention.

FIG. 1 is a flow chart illustrating a method for designing a system on a target device according to an embodiment of the present invention. The target device may be an integrated circuit such as a structured ASIC, field programmable gate array (FPGA), or other circuit. At 101, the system is synthesized. Synthesis includes generating a logic design of the system to be implemented by the target device. According to an embodiment of the present invention, synthesis generates an optimized logical representation of the system from a HDL design definition. The optimized logical representation of the system may include a representation that has a minimized number of functional blocks and registers, such as logic gates and logic elements, required for the system. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 102, the mapped logical system design is placed. Placement works on the optimized technology-mapped netlist to produce a placement for each of the functional blocks. According to an embodiment of the present invention, for a target device that is a structured ASIC, placement includes fitting the system on the integrated circuit by determining which resources on the integrated circuit are to be used for specific logic elements, and other functional blocks.

At 103, physical synthesis is performed. According to an embodiment of the present invention, optimizations are made to the placed mapped logical system design and the modifications made to the design are placed. Physical synthesis also includes performing incremental placement where identified illegalities are resolved while maintaining the quality of the optimizations made.

At 104 the system is routed. Routing involves determining how to connect the functional blocks in the system. According to an embodiment of the present invention, a cost function may be used to generate a cost associated with each routing option. The cost function may take into account, delay, capacitive loading, cross-sink loading, power, and/or other criteria.

At 105, an assembly procedure is performed. The assembly procedure involves creating a data file or set of files that includes information determined by the fitting procedure described by 101-104. The data file may be a bit stream that may be used to program the integrated circuit or a set of layout masks used to manufacture the device.

Figure 2:
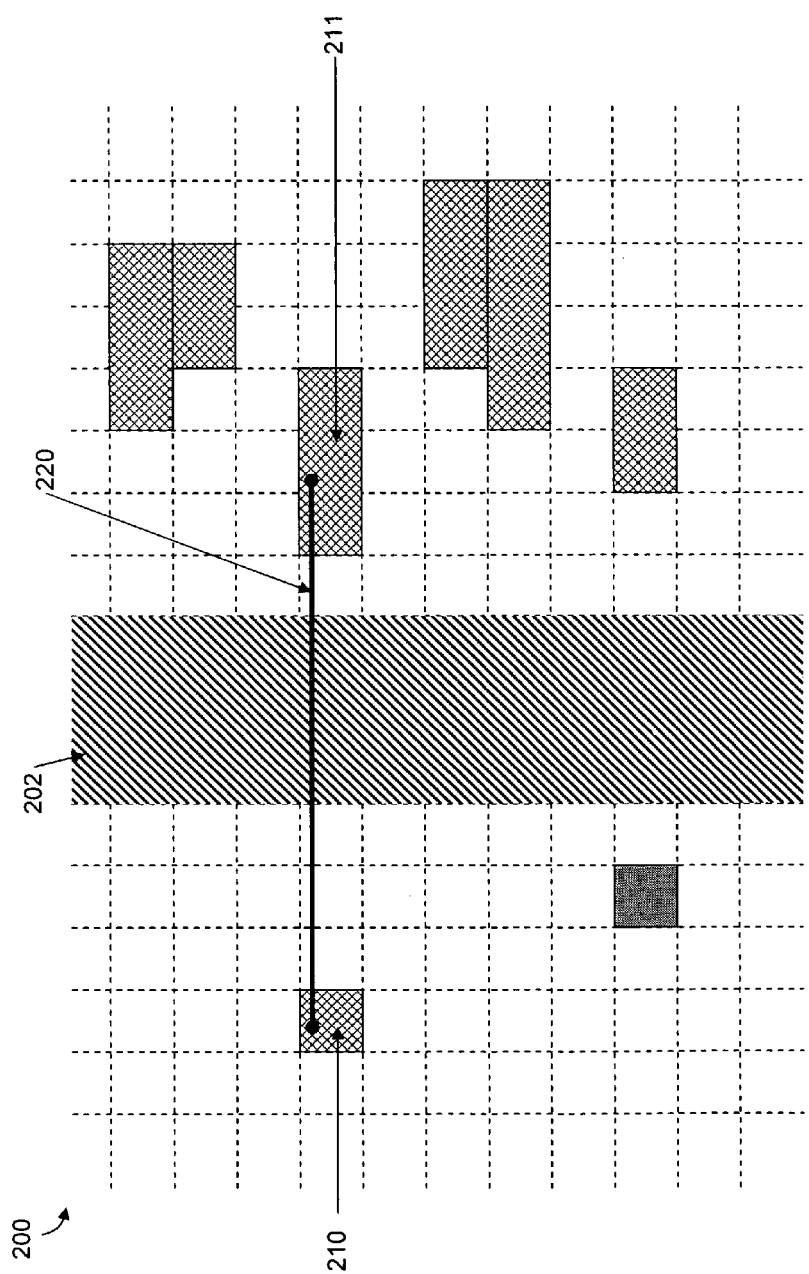
FIG. 2 illustrates an exemplary target device according to an embodiment of the present invention.

FIG. 2 illustrates an exemplary target device according to an embodiment of the present invention. In this embodiment, the target device is a structured ASIC 200. The structured ASIC 200 is a hybrid device that includes a number of pre-defined or pre-built layers used to define logic fabric and IP blocks, and a number of customizable design-specific layers that may be used to provide connectivity in the logic fabric and to/from IP blocks.

According to one embodiment, the structured ASIC 200 includes a grid of locations. Each location includes an area of equal length and width and is given a planar grid coordinate (x, y). Each a single subcell may occupy a location at a grid coordinate. A subcell is a basic building block used in the structured ASIC 200 that may be used to form a structured ASIC cell. Each subcell includes the same basic programmable circuitry. Structured ASIC cells may include one or more subcells to implement logic such as combinational and sequential circuits. As illustrated, block 210 is a first structured ASIC cell formed by a single subcell. Block 211 is a second structured ASIC cell formed by three subcells.

The structured ASIC 200 may include embedded IP blocks such as random access memory (RAM), digital signal processors (DSP), and/or input/outputs (IOs) such as that shown at 202. Customizable layers may be used to connect structured ASIC cells with other structured ASIC cells, and other components. Route 220 illustrates an exemplary connection between the first structured ASIC cell 210 and the second structured ASIC cell 211. Performing placement in a structured ASIC involves placing structured ASIC cells such that every location or grid coordinate is occupied by at most one subcell.

Figure 3:
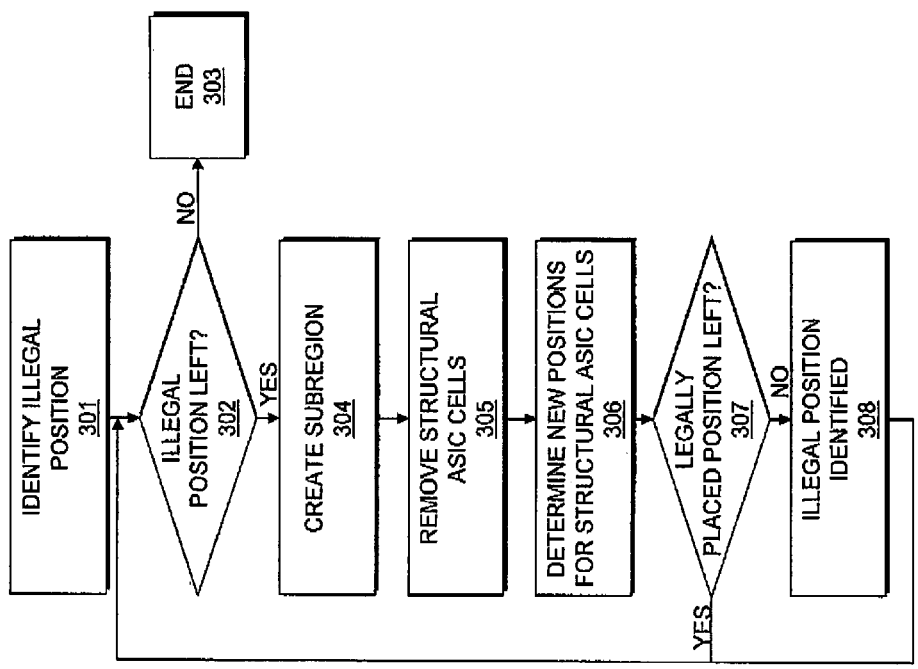
FIG. 3 is a flow chart that illustrates a method for performing incremental placement according to an embodiment of the present invention.

FIG. 3 is a flow chart that illustrates a method for performing incremental placement according to an embodiment of the present invention. The procedure described in FIG. 3 may be used to implement a portion of the procedure described at 103 in FIG. 1. At 301, illegal positions identified from post placement optimizations are identified. According to an embodiment of the present invention, an illegal position of a structured ASIC cell may involve a first structured ASIC cell occupying the same grid coordinate as a second structured ASIC cell. The illegal positions identified may be stored in a queue.

At 302, it is determined whether there are additional illegal positions left to consider. If there are no illegal positions left to consider, control proceeds to 303 and the procedure is terminated. If illegal positions are left to consider, control proceeds to 304.

At 304, a subregion is created around the illegal position. According to an embodiment of the present invention, the subregion is a predetermined size that includes one or more structured ASIC cells.

At 305, the structured ASIC cells in the subregion are removed.

At 306, new positions are determined for the structured ASIC cells removed from the subregion. New positions are determined one at a time for each structured ASIC cell removed. According to an embodiment of the present invention, determining positions for the structured ASIC cells includes determining positions for structured ASIC cells in a crowded area of the subregion before determining positions for structured ASIC cells in an un-crowded area of the subregion. Determining positions for the structured ASIC cells may also include determining positions for structured ASIC cells on critical paths before determining positions for structured ASIC cells on non-critical paths.

At 307, it is determined whether the new positions for the structured ASIC cells are legal. If the new positions for the structured ASIC cells are legal, control returns to 302. If at least one new position for the structured ASIC cells is illegal, control proceeds to 308.

At 308, the positions for the structured ASIC cells that are illegal are identified. According to an embodiment of the present invention, the illegal positions are pushed to the end of the queue.

Figure 4:
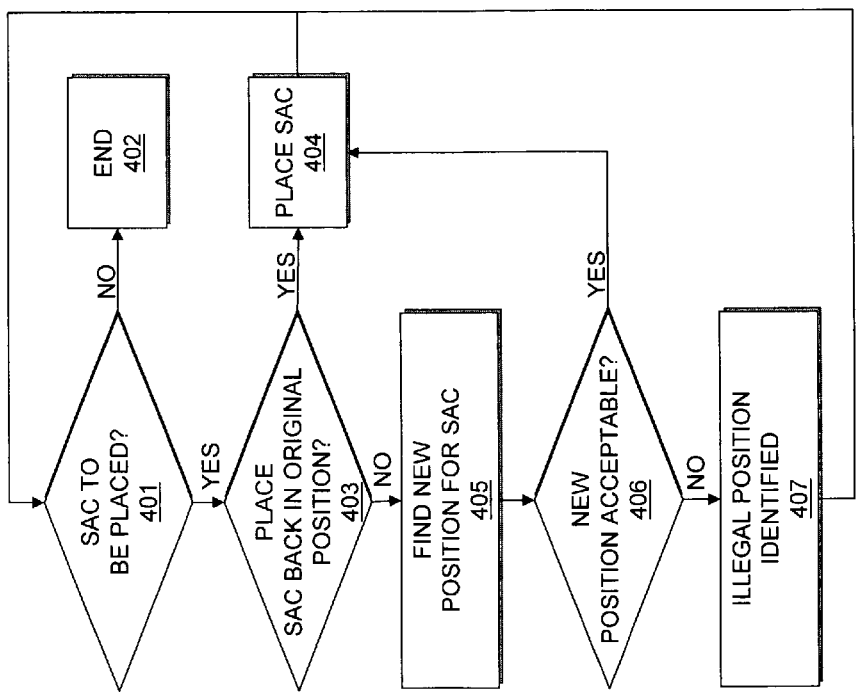
FIG. 4 is a flow chart that illustrates a method for placing a structured ASIC cell according to an embodiment of the present invention.

FIG. 4 is a flow chart that illustrates a method for placing a structured ASIC cell according to an embodiment of the present invention. The procedure described in FIG. 4 may be used to implement the procedure described at 306 shown in FIG. 3. At 401, it is determined whether an additional structured ASIC cell (SAC) from a subregion needs to be placed. If no additional structured ASIC cells from a subregion needs to be placed, control proceeds to 402 and terminates the procedure. If an additional structured ASIC cell from the subregion needs to be placed, control proceeds to 403.

At 403, it is determined whether the structured ASIC cell can be placed back in its original position. If the structured ASIC cell can be placed in its original position, control proceeds to 404. If the structured ASIC cell cannot be placed in its original position, control proceeds to 405.

At 404, the position is assigned to the structured ASIC.

At 405, a new position is determined for the structured ASIC cell that is legal.

At 406, it is determined whether the new position is within a fixed radius from its original position. If the new position is within the fixed radius from its original position, control proceeds to 404. If the new position is not within the fixed radius from its original position, control proceeds to 407.

At 407, the original position of the structured ASIC cell is re-assigned to the structured ASIC, creating an illegal position. Control returns to 401.

According to an embodiment of the present invention, determining new positions for structured ASIC cells is performed using an incremental placement technique where guide paths are identified using the transportation problem. The transportation problem takes a given set of suppliers and consumers at fixed locations where there exists a set of directed paths from suppliers to consumers with an associated cost. A subset of paths is found that fulfills the demands of all the consumers or exhausts the supply of all the suppliers such that the total cost of the used paths is minimized. The directed paths may be referred to as edges. Edges leave the suppliers and enter the consumers. Thus, the suppliers are the edge tails and the consumers are the edge heads.

Figure 5:
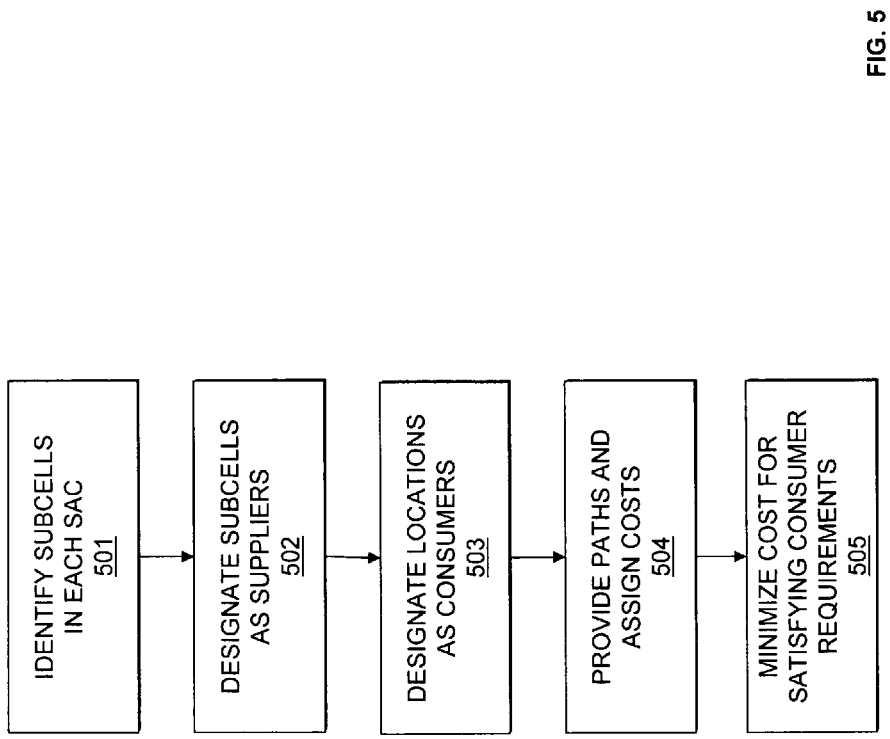
FIG. 5 is a flow chart that illustrates a method for finding a new positions for structured ASIC cells using the transportation problem according to an embodiment of the present invention.

FIG. 5 is a flow chart that illustrates a method for finding new positions for structured ASIC cells using the transportation problem according to an embodiment of the present invention. It should be appreciated that the procedure illustrated in FIG. 5 may also be used to find a new position for a single structured ASIC cell in a structured ASIC. Thus, the procedure illustrated in FIG. 5 may be used to implement the procedure described at 405 shown in FIG. 4. At 501, the subcells in structured ASIC cells are identified.

At 502, the subcells in the structured ASIC cells are designated as suppliers.

At 503, the graph coordinates in the structured ASIC are designated as consumers. According to an embodiment of the present invention only a subset of the graph coordinates in the structured ASIC is designated as consumers. The subset may include only those graph coordinates that are within a fixed distance of the subregion where the structure ASIC cells originated from.

At 504, paths are provided between the subcells (suppliers) and graph coordinates (consumers) with costs associated with each path. According to an embodiment of the present invention, paths between subcells and graph coordinates are provided only when the graph coordinates are relatively close to the original position of the structured ASIC cell corresponding to the subcells.

The cost associated with each path may be related to an estimate of delay where wire length is proportional to the delay. One metric that may be used to estimate wire length of a net is the half-length perimeter. The half-length perimeter is the width plus height of a bounding box containing all the pins of a net. The cost of a path between a structured ASIC cell and a graph coordinate would be computed as the sum of the half-lengths for all nets connected to the structured ASIC cell when placed at a given location. It should be appreciated that other techniques for measuring wire length and other criteria for determining cost may be used.

At 505, a solution is determined where the cost for satisfying consumer requirements is minimized. By solving the transportation problem, a set of paths are selected. The locations found at the heads of selected paths are used to determine a suggested location for the subcell found at the tail of the path.

Figure 6:
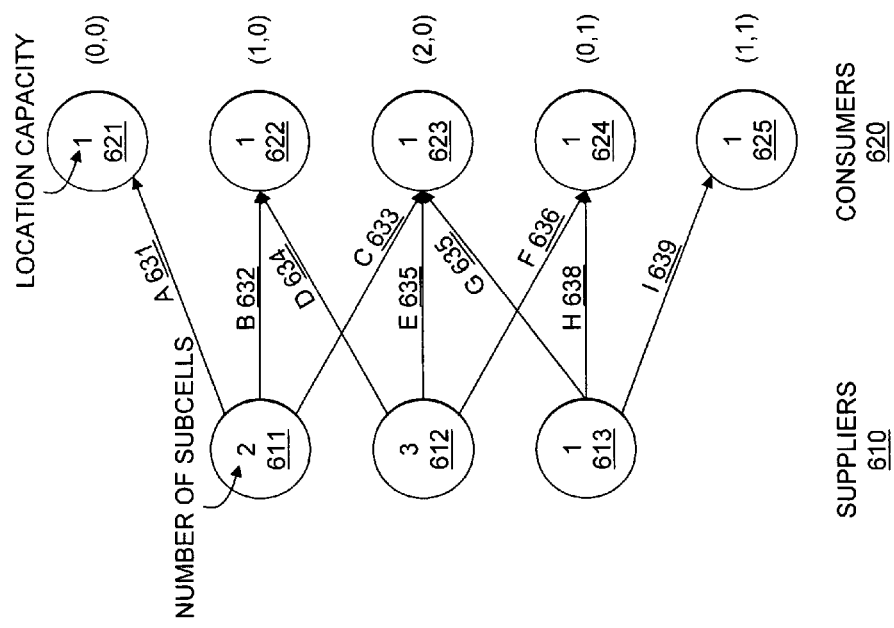
FIG. 6 illustrates a representation of incremental placement as a transportation problem according to an embodiment of the present invention.

FIG. 6 illustrates a representation of incremental placement as a transportation problem according to an embodiment of the present invention. The transportation graph 600 includes a first column of nodes 610 that represent suppliers. Each of the nodes represents a structured ASIC cell that includes a plurality of subcells. Node 611 represents a first structured ASIC cell that includes 2 subcells. Node 612 represents a second structured ASIC cell that includes 3 subcells. Node 613 represents a third structured ASIC cell that includes 1 subcell.

The transportation graph 600 includes a second column of nodes 620 that represent consumers. Each of the node represents a graph coordinate on the structured ASIC. Node 621 represents a first graph coordinate (0,0). Node 622 represents a second graph coordinate (1,0). Node 623 represents a third graph coordinate (2,0). Node 624 represents a fourth graph coordinate (0,1). Node 625 represents a fifth graph coordinate (1,1).

The transportation graph includes a plurality of paths or edges 631-639 that connect the nodes representing suppliers 610 and the nodes representing consumers 620. Paths 631-639 have costs a-i associated with them respectively.

According to an embodiment of the present invention, one way to formulate a solution to the transportation problem illustrated in FIG. 6 is shown below, where paths 631-639 are designated as x11, x12, x13, x21, x22, x23, x31, x32, and x33, respectively.

Minimize $a*x11+b*x12, +c*x13+d*x21+e*x22+f*x23+g*x31+h*x32+i*x33$

Subject to:
$x11+x12+x13<=2$
$x21+x22+x23<=3$
$x31+x32+x33<=1$
$x11>=1$
$x12+x21>=1$
$x13+x22+x31>=1$
$x23+x32>=1$
$x33>=1$ This is under the assumption that all suppliers' demands will be met. If this is not the case, there will be no solution to the above example.

It should be appreciated that the transportation problem may be solved using any linear programming or other appropriate technique or procedure, such as the minimum-cut bipartite graph problem and graph theory algorithms.

FIG. 7a-c illustrates an example of replacement using a suggested location from a solution to the transportation problem. In order to consolidate subcells, their center of gravity may be used as a suggested location of a structured ASIC cell. This suggested location may be used to create a directed vector to be used for guided shifting of structured ASIC cells as illustrated in FIG. 7a. FIG. 7b illustrates the shifting procedure if the structured ASIC cell placement location is occupied. FIG. 7c illustrates a final valid location found for the structured ASIC cell.

Figure 8:
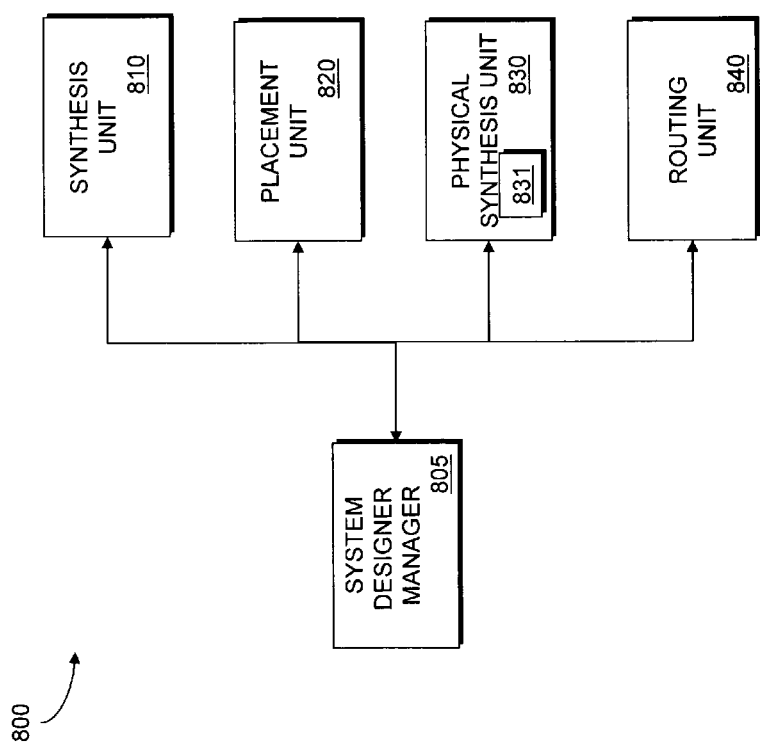
FIG. 8 illustrates a block diagram of a system designer according to an embodiment of the present invention.

FIG. 8 illustrates a system designer 800 according to an embodiment of the present invention. The system designer 800 may be an EDA tool for designing a system on an integrated circuit. The integrated circuit may be, for example, an application specific integrated circuit (ASIC), a structured application specific integrated circuit (Structured ASIC), a field programmable gate array (FPGA) or other circuitry. Furthermore the integrated circuit may be implemented using semiconductor or nanoelectronic technology. FIG. 8 illustrates software modules implementing an embodiment of the present invention. According to one embodiment, system design may be performed by a computer system (not shown) executing sequences of instructions represented by the software modules shown in FIG. 8. Execution of the sequences of instructions causes the computer system to support system design as will be described hereafter. In alternate embodiments, hard-wire circuitry may be used in place of or in combination with software instructions to implement the present invention. Thus, the present invention is not limited to any specific combination of hardware circuitry and software. The system designer 800 includes a designer manager 805. The designer manager 805 is connected to and transmits data between the components of the system designer 800.

Block 810 represents a synthesis unit. The synthesis unit 810 generates a logic design of a system to be implemented in the integrated circuit or other target device. According to an embodiment of the system designer 800, the synthesis unit 810 takes a conceptual Hardware Description Language (HDL) design definition and generates an optimized logical representation of the system. The optimized logical representation of the system generated by the synthesis unit 810 may include a representation that has a minimized number of functional blocks and registers, such as logic gates and logic elements, required for the system. Alternatively, the optimized logical representation of the system generated by the synthesis unit 810 may include a representation that has a reduced depth of logic and that generates a lower signal propagation delay. The synthesis unit 810 also determines how to implement the functional blocks and registers in the optimized logic representation utilizing specific resources on a target integrated circuit thus creating an optimized "technology-mapped" netlist. The technology-mapped netlist illustrates how the resources on the integrated circuit are utilized to implement the system. In an embodiment where the integrated circuit is an ASIC, the components could be gates or standard cells. In an embodiment where the integrated circuit is a structured ASIC, the technology-mapped netlist may contain components that can be implemented in the structured ASIC fabric, such as RAM blocks, multiplier blocks, and gates from a library of implementable gates.

Block 820 represents a placement unit 820. The placement unit 820 helps map the system on to the integrated circuit by determining which resources or areas on the integrated circuit are to be used for specific functional blocks and registers. According to an embodiment of the system designer 800, the placement unit 820 first determines how to implement portions of the optimized logic design in clusters. Clusters may represent a subset of the components on the integrated circuit. In an embodiment where the integrated circuit is a structured ASIC, a cluster or structured ASIC cell may be represented, for example, by a number of standard cells such as subcells grouped together. In this embodiment, after portions of the optimized logic design are implemented in clusters, the clusters may be placed by assigning the clusters to specific positions on the integrated circuit. The placement unit 820 may utilize a cost function in order to determine a good assignment of resources on the integrated circuit to find a placement solution.

Block 830 represents a physical synthesis unit 830. The physical synthesis unit 830 optimizes the placed system and performs placement on the modifications made. The physical synthesis unit includes an incremental placement unit 831 that performs incremental placement on identified illegalities resulting from the placement of the modifications. The incremental placement unit 831 attempts to resolve the illegalities while maintaining the quality of the optimizations made.

Block 840 represents a routing unit 840. The routing unit 840 determines how to provide interconnection between the functional blocks and registers on the integrated circuit. The routing unit 830 may use a cost function to generate a total cost associated with each routing option. The cost function may take into account, delay, cross-sink loading, capacitive loading on a net, power and/or other criteria.

FIG. 9 illustrates an incremental placement unit 900 according to an embodiment of the present invention. The incremental placement unit 900 includes a placement manager 910. The placement manager 910 is connected to and transmits data between the components of the incremental placement unit 900.

The incremental placement unit 900 includes a subregion identifier unit 920. The subregion identifier unit 920 identifies a subregion that includes an illegal position in a placement solution. The subregion may include one or more structured ASIC cells.

The incremental placement unit 900 includes a priority unit 930. The priority unit 920 prioritizes the structured ASIC cells in the subregions for position placement. According to an embodiment of the present invention, the priority unit 930 may determine an order of priority based on crowdedness of areas in the subregion, criticality of paths through the structured ASIC cells, and/or other criteria.

The incremental placement unit 900 includes an optimization unit 940. For structured ASIC cells that are unable to be placed back in their original locations, the optimization unit sets up and solves a transportation problem to determine positions that are legal for the structured ASIC cell. The components described in FIG. 9 may implement the procedures described in FIGS. 3-5.

FIGS. 1, and 3-5 are flow charts illustrating methods according to embodiments of the present invention. The techniques illustrated in these figures may be performed sequentially, in parallel or in an order other than that which is described. It should be appreciated that not all of the techniques described are required to be performed, that additional techniques may be added, and that some of the illustrated techniques may be substituted with other techniques. It should be appreciated that the techniques may be used in any EDA tool for the creation/processing/optimization/implementation of any electronic design, such as that encountered in the creation of structured ASICs, ASICs, FPGAs, or other circuits.

Embodiments of the present invention may be provided as a computer program product, or software, or firmware that may include an article of manufacture on a machine accessible or a machine-readable medium having instructions. The instructions on the machine accessible medium may be used to program a computer system or other electronic device. The machine accessible medium may include, but is not limited to, floppy diskettes, optical disks, CD-ROMs, magneto-optical disks, or other type of media/machine accessible medium suitable for storing or transmitting electronic instructions. The techniques described herein are not limited to any particular software configuration. They may find applicability in any computing or processing environment. The term "machine accessible medium" used herein shall include any medium that is capable of storing, encoding, or transmitting a sequence of instructions for execution by the machine and that cause the machine to perform any one of the methods described herein. Furthermore, it is common in the art to speak of software, in one form or another (e.g., program, procedure, process, application, module, unit, logic, firmware and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A computer implemented method of placing a system on a structured application specific integrated circuit (ASIC), the method comprising:

identifying a subregion from a layout design placement solution for structured ASIC cells that includes a first structured ASIC cell that overlaps a component and is positioned illegally;

removing the first structured ASIC cells and a second structured ASIC cell in the subregion from the layout design placement solution;

determining a legal position for any of the first and the second structured ASIC cells residing in a crowded area of the subregion as determined from the layout design placement solution prior to determining a legal position for any of the first and second structured ASIC cells residing in an un-crowded area of the subregion as determined from the layout design placement solution; and placing the first and the second structured ASIC cells from the subregion at determined legal positions.

2. The computer implemented method of claim 1 further comprising determining legal positions for a first additional structured ASIC cells from the subregion that are on critical paths in the layout design placement solution before determining legal positions for a second additional structured ASIC cells from the subregion that are on non-critical paths in the layout design placement solution.

3. The computer implemented method of claim 1 further comprising:

removing a third and fourth structured ASIC cell in the subregion from the layout design placement solution;

assigning the third structured ASIC cell from the subregion back to a first position which it originally occupied in the layout design placement solution;

assigning the fourth structured ASIC cell from the subregion back to a second position which it originally occupied in the layout design placement solution;

determining a legal position for the fourth structured ASIC cell in response to determining that the first position is at a same location as the second position; and determining a legal position for the third structured ASIC cell in response to the legal position for the fourth structured ASIC cell exceeding a fixed radius from the second position.

4. The computer implemented of claim 1, wherein determining the legal position for the second structured ASIC cell comprises using a solution to a transportation problem that models subcells, locations, and wirelength on the structured ASIC with suppliers, consumers, and cost.

5. The computer implemented of claim 4, wherein the transportation problem models the structured ASIC cells as suppliers and graph coordinates on the structured ASIC as consumers.

6. The computer implemented of claim 5, wherein cost associated with each path between suppliers and consumers is related to an estimate of delay associated with wire length.

7. The computer implemented method of claim 4, wherein the transportation problem is solved using linear programming.

8. The computer implemented of claim 1, wherein determining the legal position for the second structured ASIC cell comprises:

designating subcells of structured ASIC Cells from the subregion as suppliers;

designating locations on the structured ASIC as consumers;

designating wire length between the subcells and locations as costs; and reducing cost associated with the consumer's specification.

9. The computer implemented of claim 8, wherein costs are determined by a sum of half-length perimeters for nets connected to a structured ASIC cell, wherein a half-length perimeter is a width plus height of a bounding box that includes all pins of a net.

10. The computer implemented of claim 1, wherein determining the legal position for the second structured ASIC cell comprises using a center of gravity of subcells of the second structured ASIC cell.

11. The computer implemented method of claim 1, wherein an illegal position in the placement solution includes two structured ASIC cells occupying a same grid coordinate.

12. An article of manufacture comprising a machine accessible medium including sequences of instructions, the sequences of instructions including instructions which when executed cause the machine to perform:

identifying a subregion from a layout design placement solution for structured ASIC cells that includes a first structured ASIC cell in a first position and a second structured ASIC cell in a second position;

removing the first and the second structured ASIC cells in the subregion from the layout design placement solution;

subsequent to the removing, assigning the first structured ASIC cell from the subregion back to the first position;

subsequent to the removing, assigning the second structured ASIC cell from the subregion back to the second position;

determining a legal position without overlap for the second structured ASIC cell in response to determining that the first position is at a same location as the second position resulting in an illegal placement;

determining a legal position without overlap for the first structured ASIC cell in response to determining that the determined legal position without overlap for the second structured ASIC cell exceeds a fixed radius from the second position; and placing the first and second structured ASIC cells based on the assigning and determining procedures.

13. The article of manufacture of claim 12 further comprising determining legal positions for the structured ASIC cells from the subregion by determining a legal position for structured ASIC cells residing in a crowded area of the subregion before determining a legal position for structured ASIC cells residing in an un-crowded area.

14. The article of manufacture of claim 12 further comprising determining legal positions for the structured ASIC cells from the subregion by determining legal positions for structured ASIC cells on critical paths before determining legal positions for structured ASIC cells on non-critical paths.

15. The article of manufacture of claim 12 further comprising determining legal positions for the structured ASIC cells from the subregion by using a solution to a transportation problem that models subcells, locations, and wirelength on the structured ASIC with suppliers, consumers, and cost.

16. The article of manufacture of claim 15, wherein the transportation problem models the structured ASIC cells as suppliers and graph coordinates on the structured ASIC as consumers.

17. The article of manufacture of claim 16, wherein cost associated with each path between suppliers and consumers is related to an estimate of delay associated with wire length.

18. The article of manufacture of claim 15, wherein the transportation problem is solved using linear programming.

19. The article of manufacture of claim 12 further comprising determining legal positions for all the structured ASIC cells from the subregion by:

designating subcells of structured ASIC cells from the subregion as suppliers;

designating locations on the structured ASIC as consumers;

designating wire length between the subcells and locations as costs; and finding a solution that generates a reduced cost required to satisfy requirements of the consumers.

20. The article of manufacture of claim 19, wherein costs are determined by a sum of half-length perimeters for nets connected to a structured ASIC cell, wherein the half-length perimeter is a width plus height of a bounding box that includes all the pins of a net.

21. The article of manufacture of claim 12, wherein an illegal position in the placement solution includes two structured ASIC cells occupying a same grid coordinate.

22. A system designer comprising:
a synthesis unit operable to generate a logic design of a system to be implemented by a structured application specific integrated circuit (ASIC);
a placement unit operable to determine a layout design placement solution of functional blocks of the logic design on the structured ASIC; and
an incremental placement unit operable to identify a first structured ASIC cell that overlaps a component and is in an illegal position in the layout design placement solution, create a subregion that includes the first structured ASIC cell, remove the first structured ASIC cell and a second structured ASIC cell in the subregion from the layout design placement solution, determine legal positions for the first and second structured ASIC cells by determining a legal position for the first structured ASIC cell residing in a crowded area of the subregion as determined by the layout design placement solution prior to determining a legal position for the second structured ASIC cell residing in an un-crowded area of the subregion, as determined by the layout design placement solution wherein the placement unit is operable to place the first and second structured ASIC cells in the legal positions.

23. The system designer of claim 22, wherein the incremental placement unit comprises a priority unit operable to assign an order for determining legal positions for structured ASIC cells from the subregion.

24. The system designer of claim 23, wherein the order is based on crowdedness of areas in the subregion and criticality of paths through the structured ASIC cells.

25. The system designer of claim 22, wherein an illegal position in the placement solution includes two structured ASIC cells occupying a same grid coordinate.

26. The system designer of claim 22, wherein the incremental placement unit is operable to set up and solve a transportation problem to determine positions that are legal for all structured ASIC cells from the subregion and the transportation problem models the structured ASIC cells as suppliers and graph coordinates on the structured ASIC as consumers.

27. The system designer of claim 26, wherein cost associated with each path between suppliers and consumers is related to an estimate of delay associated with wire length.

28. The system designer of claim 26, wherein the transportation problem is solved using linear programming.

* * * * *